(12) United States Patent
Ito

(10) Patent No.: US 10,151,974 B2
(45) Date of Patent: Dec. 11, 2018

(54) ELECTROOPTICAL APPARATUS, PRODUCTION METHOD FOR THE ELECTROOPTICAL APPARATUS, AND ELECTRONIC APPLIANCE

(71) Applicant: SEIKO EPSON CORPORATION, Tokyo (JP)

(72) Inventor: Satoshi Ito, Eniwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 204 days.

(21) Appl. No.: 15/405,701

(22) Filed: Jan. 13, 2017

(65) Prior Publication Data

US 2017/0131631 A1 May 11, 2017

Related U.S. Application Data

(62) Division of application No. 15/060,077, filed on Mar. 3, 2016, now Pat. No. 9,933,700.

(30) Foreign Application Priority Data

Apr. 1, 2015 (JP) ................................. 2015-074868

(51) Int. Cl.
   *G02B 26/08* (2006.01)
   *G03F 7/00* (2006.01)
   (Continued)

(52) U.S. Cl.
   CPC ......... *G03F 7/0035* (2013.01); *G02B 7/1821* (2013.01); *G02B 26/0833* (2013.01);
   (Continued)

(58) Field of Classification Search
   CPC ...... G03F 7/0035; G03F 7/0005; G03F 7/039; G03F 7/038; G03F 7/027; G03F 7/095;
   (Continued)

(56) References Cited

U.S. PATENT DOCUMENTS 5,061,049 A   10/1991   Hornbeck
5,083,857 A   1/1992    Hornbeck
(Continued)

FOREIGN PATENT DOCUMENTS

JP   H05-196880 A   8/1993
JP   H08-227042 A   9/1996
(Continued)

OTHER PUBLICATIONS

Apr. 3, 2017 Office Action Issued in U.S Appl. No. 15/060,077.
Oct. 7, 2016 Office Action issued in U.S. Appl. No. 15/060,077.
Aug. 4, 2017 Office Action Issued in U.S. Appl. No. 15/060,077.

*Primary Examiner* — John A McPherson
(74) *Attorney, Agent, or Firm* — Oliff PLC

(57) ABSTRACT

An electrooptical apparatus includes a torsion hinge and a mirror support post that are formed integrally with an electroconductive member. Of the mirror support post (second support post), a first end portion at a substrate side has an open end whose opening faces the substrate. Of the mirror support post, a second end portion at a mirror side is a flat plate portion that closes the opening of the mirror support post. A mirror is in contact with the opposite side of the flat plate portion to the substrate. A first sacrificial layer for use for production of the electrooptical apparatus is formed by exposing and developing a photosensitive resist.

5 Claims, 10 Drawing Sheets

(51) Int. Cl.
  *G02B 7/182* (2006.01)
  *G03F 7/038* (2006.01)
  *G03F 7/039* (2006.01)
  *G03F 7/095* (2006.01)
  *G03F 7/20* (2006.01)
  *G03F 7/26* (2006.01)

(52) U.S. Cl.
  CPC ............ *G03F 7/0005* (2013.01); *G03F 7/038* (2013.01); *G03F 7/039* (2013.01); *G03F 7/095* (2013.01); *G03F 7/2002* (2013.01); *G03F 7/2022* (2013.01); *G03F 7/26* (2013.01)

(58) Field of Classification Search
  CPC . G03F 7/2002; G03F 7/2022; G02B 26/0833; G02B 26/0841
  USPC .................................................. 430/319, 321
  See application file for complete search history.

(56) References Cited

U.S. PATENT DOCUMENTS

| | | | |
|---|---|---|---|
| 5,583,688 A * | 12/1996 | Hornbeck | G02B 26/0841 359/224.1 |
| 5,600,383 A | 2/1997 | Hornbeck | |
| 5,631,782 A | 5/1997 | Smith et al. | |
| 5,650,881 A | 7/1997 | Hornbeck | |
| 5,703,728 A | 12/1997 | Smith et al. | |
| 5,784,212 A | 7/1998 | Hornbeck | |
| 2005/0275930 A1 | 12/2005 | Patel et al. | |
| 2007/0066063 A1* | 3/2007 | DiCarlo | G03F 7/40 438/689 |
| 2008/0100899 A1 | 5/2008 | Shimokawa et al. | |
| 2008/0130079 A1 | 6/2008 | Strumpell | |
| 2008/0220552 A1 | 9/2008 | Pan | |
| 2008/0297874 A1 | 12/2008 | Pan | |
| 2012/0162735 A1 | 6/2012 | Uchiyama et al. | |
| 2014/0192397 A1 | 7/2014 | Atnip | |

FOREIGN PATENT DOCUMENTS

| | | |
|---|---|---|
| JP | H08-227043 A | 9/1996 |
| JP | 2005-202257 A | 7/2005 |
| JP | 2007-510174 A | 4/2007 |
| JP | 2010-039498 A | 2/2010 |
| JP | 2013-068678 A | 4/2013 |

* cited by examiner

ST1, ST2

ST3

ST4

ST5

ST6, ST7

ST8

ST9

ST10

ST11

ST12

ST13

ST14

ST3

ST9

ST6

ST11

ST7

ST12, St13

ELECTROOPTICAL APPARATUS, PRODUCTION METHOD FOR THE ELECTROOPTICAL APPARATUS, AND ELECTRONIC APPLIANCE

CROSS REFERENCE

This is a division of U.S. application Ser. No. 15/060,077, filed Mar. 3, 2016, which claims priority to Japanese Patent Application No. 2015-074868, filed Apr. 1, 2015. The entirety of both applications is expressly incorporated by reference herein.

BACKGROUND

1. Technical Field

The present invention relates to an electrooptical apparatus that includes a mirror, a production method for the electrooptical apparatus, and an electronic appliance.

2. Related Art

As electronic appliances, for example, projection type display apparatuses that modulate light emitted from a light source using a plurality of mirrors (micro mirrors) of an electrooptical apparatus called DMD (digital mirror device) and perform magnifying projection of the modulated light using a projection optical system so as to display images on a screen are known. In the electrooptical apparatus used in such an electronic appliance, the mirrors are supported on torsion hinges (twist hinges) via mirror support posts and are electrically connected to the torsion hinges. Besides, the torsion hinges are supported by substrate-side bias electrodes formed on a substrate with the hinge support posts interposed therebetween, and are also electrically connected to the substrate-side bias electrodes. Therefore, by applying a bias voltage from a substrate-side bias electrode to a corresponding one of the mirrors and applying a drive voltage to an address electrode, the mirror can be driven due to electrostatic force created between the mirror and the address electrode. In a production process for an electrooptical apparatus having such a construction, torsion hinges, mirrors, and the like are formed by using a sacrificial layer made of a resin material.

If, at this time, the mirror support post of a mirror has a recess portion facing a side opposite the substrate, a large dimple is formed on the surface of the mirror, so that the reflectance of the surface of the mirror (reflecting surface thereof) decreases. Therefore, JP-T-2007-510174 proposes that an inorganic material is accumulated on surfaces of the mirror support posts, the sacrificial layer, etc., and polished, and then a reflecting film that forms the mirrors is formed. Besides, for formation of a mirror support post, JP-A-8-227042 proposes a construction in which a metal layer is formed on a surface of a columnar sacrificial layer (resin layer) left on a torsion hinge.

However, in order to fill the recess portion by accumulating an inorganic material as in a construction described in JP-T-2007-510174, the inorganic material needs to be accumulated to a considerably great thickness; moreover, the inorganic material cannot be polished at high speed. Therefore, there arises a problem that it takes a long processing time to remove the inorganic material from the surfaces of the sacrificial layer and the like by polishing.

Furthermore, if a mirror support post is formed by stacking a metal layer on a columnar resin layer as in the construction described in JP-A-8-227042, there is a risk that a gas may be produced from the sacrificial layer when the temperature of the electrooptical apparatus rises due to emitted light or due to heat generation of the substrate or the like at the time of operating a drive circuit. Such a gas, if it adheres to the surface (reflecting surface) of a mirror, degrades the reflectance of the mirror, and is therefore not preferable. Furthermore, in order to form a torsion hinge (twist hinge) and a mirror support post, it is necessary to adopt a step of forming two metal layers and of forming an insulating intermediate layer between the two metal layers and performing the patterning thereof, resulting in a complicated production process for the electrooptical apparatus.

SUMMARY

An advantage of some aspects of the invention is that a mirror without any large dimple on its surface can be efficiently formed, without a sacrificial layer remaining on a mirror support post that supports the mirror.

An electrooptical apparatus according to an aspect of the invention includes a substrate, a first support post (hinge support post) that is provided at a one surface side of the substrate and that is protruded toward the substrate and that is supported by the substrate, an electroconductive member in which a twist hinge (torsion hinge) supported by the substrate via the first support post and a tubular second support post (mirror support post) which is protruded from the torsion hinge toward a side opposite the substrate and whose first end portion at a torsion hinge side has an open end that faces the substrate are formed integrally with each other, and a mirror that is in contact with a second end portion of the second support post which is at an opposite side of the second support post to the substrate.

A production method for an electrooptical apparatus according to another aspect of the invention includes a first sacrificial layer-forming step of forming a first sacrificial layer that includes a first opening portion (hinge support post-dedicated opening portion) and a columnar protrusion portion protruded toward a side opposite a substrate by exposing and developing a photosensitive resin layer formed at a one surface side of the substrate, a first electroconductive film-forming step of forming a first electroconductive film on an opposite side of the first sacrificial layer to the substrate and inside the first opening portion, a first patterning step of forming a first support post made of the first electroconductive film formed inside the first opening portion, a torsion hinge provided integrally with the first support post (hinge support post), and a tubular second support post that is protruded from the torsion hinge toward the side opposite the substrate and that is provided integrally with the torsion hinge, by patterning the first electroconductive film, a second sacrificial layer-forming step of forming a second sacrificial layer on the torsion hinge and on an opposite side of the second support post to the substrate, a planarizing step of causing the second support post to be bare by planarizing the second sacrificial layer from the side opposite the substrate, a second electroconductive film-forming step of forming a second electroconductive film on an opposite side of the second sacrificial layer to the substrate, a second patterning step of forming a mirror by patterning the second electroconductive film, and a sacrificial layer-removing step of removing the first sacrificial layer and the second sacrificial layer.

In the invention, the mirror support post (second support post) protruded from the torsion hinge toward the side opposite the substrate has a tubular shape and the first end portion thereof at the substrate side has an open end. Therefore, even if a sacrificial layer exists inside at the time of forming the mirror support post, the sacrificial layer can be removed. Therefore, the resin that forms the sacrificial layer does not remain within the mirror support post, so that even when the temperature of the electrooptical apparatus rises due to emitted light or due to heat generation of the substrate or the like at the time of operation of the drive circuit, production of gas from a sacrificial layer does not occur. Consequently, an event in which gas produced from the sacrificial layer decreases the reflectance of the surfaces of the mirrors (reflecting surfaces) will not occur. When, on the opposite side of the second support post (mirror support post) to the substrate, the second end portion is a flat portion, a mirror separate from the second support post can be connected to the second support post. Therefore, no dimple is formed on the surface of the mirror. Hence, light utilization efficiency can be improved and the decrease in contrast level due to the scattering by the mirror can be restrained. Furthermore, unlike the case where recess portions are filled with an inorganic material, there is no need to remove the thick inorganic material filling the recess portions from the surface of the mirror, so that the second support post that does not cause formation of dimples on the surface of the mirror can be efficiently formed. Still further, the second support post protruded from the torsion hinge toward the side opposite the substrate has a tubular shape, and the substrate-side first end portion has an open end and is formed integrally with the torsion hinge. Therefore, it becomes possible to restrain the decrease in strength that occurs in a boundary portion between the second support post and the torsion hinge, so that reliability of the electrooptical apparatus will improve.

In the invention, the second end portion may be a flat plate portion that closes an opening of the second support post. According to this construction, the second support post and the mirror can be certainly electrically connected.

In the invention, a curved sectional shape may be present between the second support post and the torsion hinge. This construction has an advantage that stress that acts in the torsion hinge from the mirror via the second support post does not easily concentrate at a specific site.

In the invention, an outer peripheral surface of the second support post may be a tapered surface that faces a mirror side. According to this construction, the strength of the second support post can be increased.

In the production method for the electrooptical apparatus according to the invention, in the first sacrificial layer-forming step, the first sacrificial layer may be formed by performing a first step of forming a first photosensitive resin layer, a second step of forming the first opening portion by exposing and developing the first photosensitive resin layer, a third step of forming a second photosensitive resin layer that lies over an opposite side of the first photosensitive resin layer to the substrate, and a fourth step of forming the protrusion portion by exposing and developing the second photosensitive resin layer.

In the production method according to the invention, the first sacrificial layer-forming step may include a process in which after a photosensitive resin layer is formed, the first sacrificial layer that includes the columnar protrusion portion protruded toward the side opposite the substrate is formed by exposing the photosensitive resin layer with a halftone mask and then developing the photosensitive resin layer.

Furthermore, in the production method according to the invention, as the photosensitive resin layer, a positive-type photosensitive resin layer may be used. Still further, as the photosensitive resin layer, a negative-type photosensitive resin layer may be used.

The electrooptical apparatus according to the invention can be used in various electronic appliances. In such cases, the electronic appliance is provided with a light source unit that emits light source light to the mirror. Furthermore, in the case where such an electronic appliance is a projection type display apparatus or a head-mounted display apparatus, the electronic appliance is further equipped with a projection optical system that projects light modulated by the mirror.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
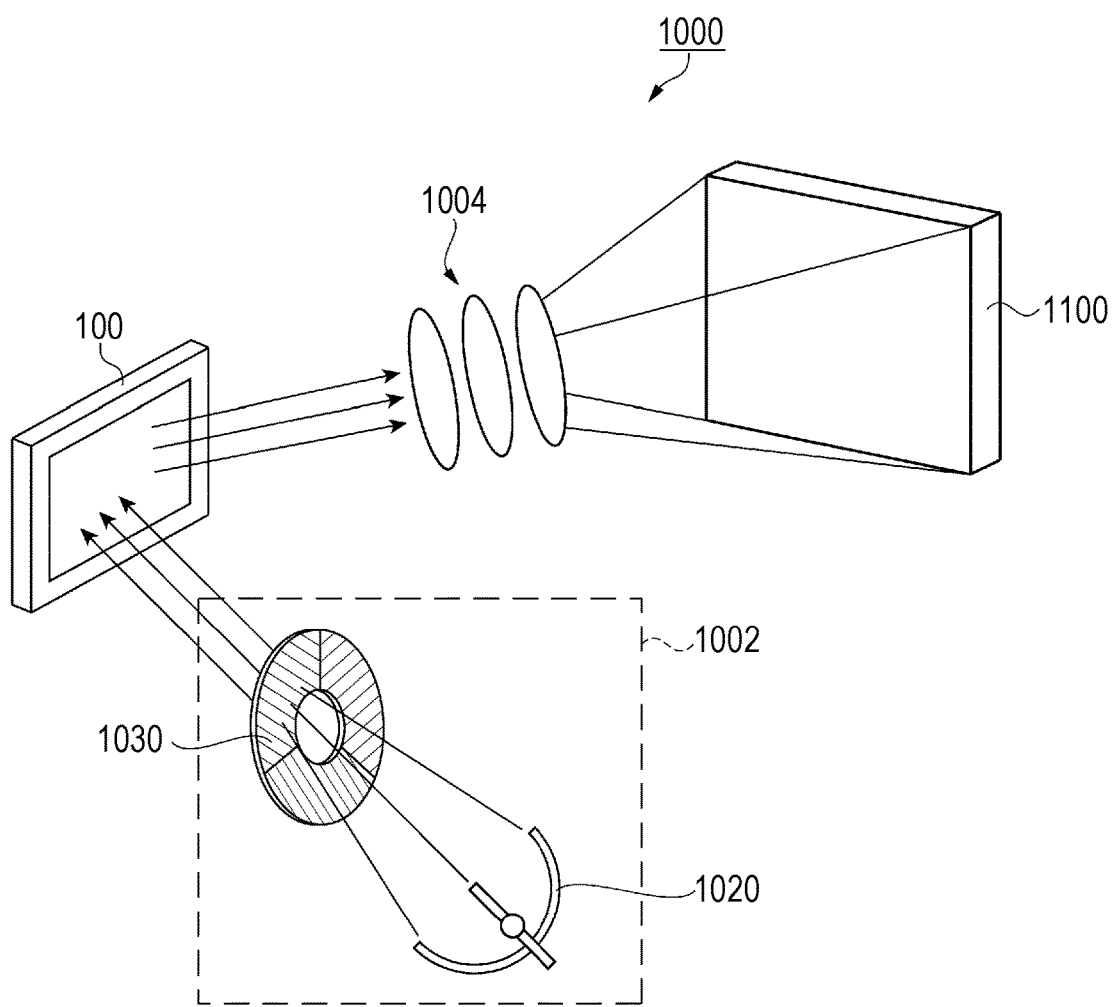
FIG. 1 is a schematic diagram showing an optical system of a projection type display apparatus as an electronic appliance to which the invention has been applied.

Exemplary embodiments of the invention will be described with reference to the accompanying drawings. In the following description, a projection type display apparatus will be described as an electronic appliance according to the invention. In the drawings that will be referred to in the following description, various layers and members are shown on different scales so that the sizes of the layers and the members in the drawings allow easy recognition of the layers and the members. Besides, the numbers of mirrors and the like shown in the drawings are less than the actual numbers thereof.

Projection Type Display Apparatus as Electronic Appliance

FIG. 1 is a schematic diagram showing an optical system of a projection type display apparatus as an electronic appliance according to the invention. A projection type display apparatus 1000 shown in FIG. 1 includes a light source unit 1002, an electrooptical apparatus 100 that, according to image information, modulates light emitted from the light source unit 1002, and a projection optical system 1004 that projects light modulated by the electrooptical apparatus 100 as a projected image onto a projection target 1100 such as a screen. The light source unit 1002 includes a light source 1020 and a color filter 1030. The light source 1020 emits white light and the color filter 1030, as it rotates, emits light of various colors. The electrooptical apparatus 100 modulates incident light at timing synchronized with the rotation of the color filter 1030. Note that, instead of the color filter 1030, a phosphor substrate that converts light emitted from the light source 1020 into light of various colors may be used. Furthermore, light source units 1002 and electrooptical apparatuses 100 may be provided separately for light of each color.

Basic Construction of Electrooptical Apparatus 100

Figure 2A:
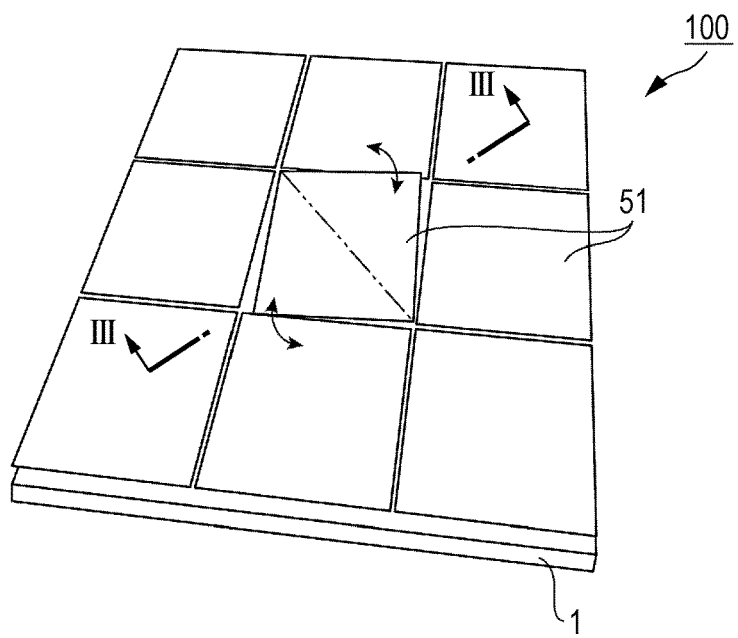
FIGS. 2A and 2B are illustrative diagrams schematically showing a basis construction of an electrooptical apparatus to which the invention has been applied.
Figure 2B:
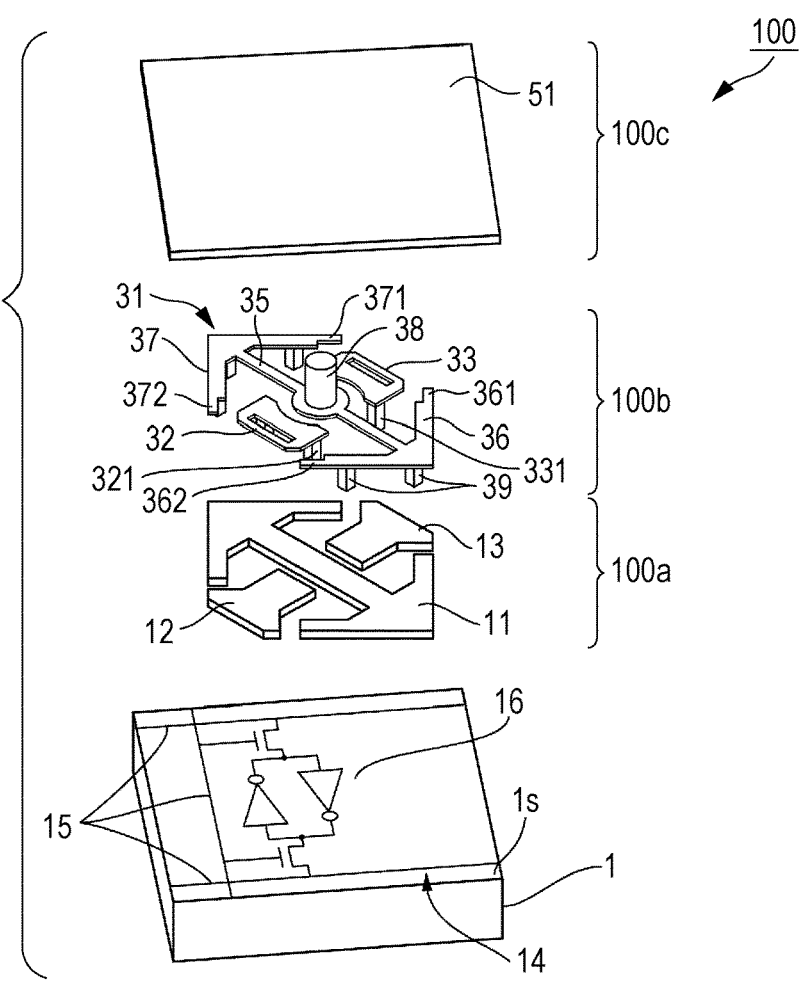
Figure 3A:
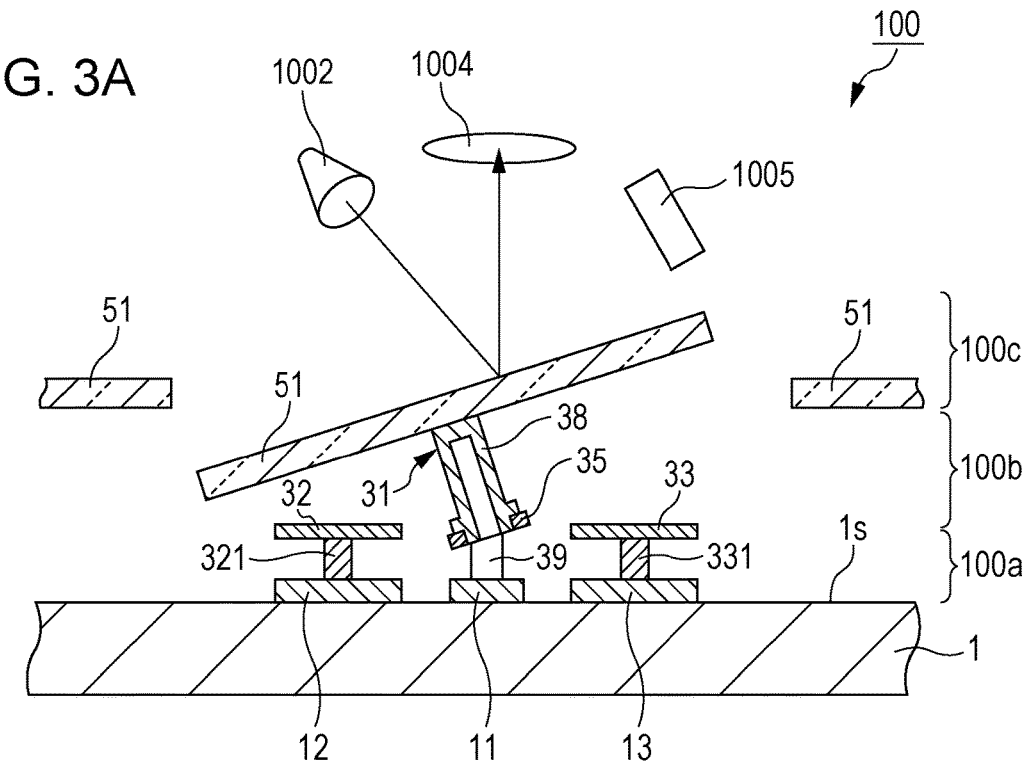
FIGS. 3A and 3B are illustrative diagrams schematically showing sectional views of portions of the electrooptical apparatus according to the invention, the sectional views being taken on line III-III in FIG. 2A.
Figure 3B:
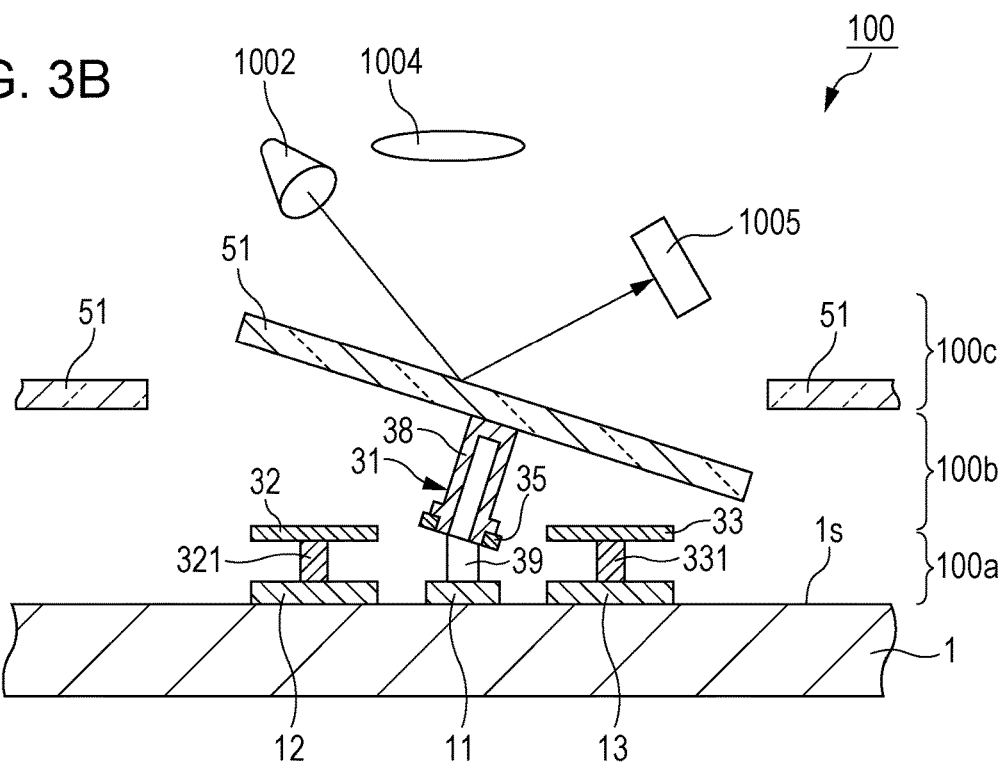

FIGS. 2A and 2B schematically illustrate a basic construction of the electrooptical apparatus 100 according to the invention. FIG. 2A is an illustrative diagram showing portions of the electrooptical apparatus 100. FIG. 2B is an exploded perspective view of portions of the electrooptical apparatus 100. FIGS. 3A and 3B are illustrative diagrams schematically showing sectional views of portions of the electrooptical apparatus 100 according to the invention taken on line III-III in FIG. 2A. FIG. 3A schematically shows a state in which a mirror is tilted to one side, and FIG. 3B schematically shows a state in which the mirror is tilted to another side.

As shown in FIGS. 2A and 2B and FIGS. 3A and 3B, the electrooptical apparatus 100 includes a plurality of mirrors 51 disposed in a matrix arrangement on a one-side surface is of a substrate 1. The mirrors 51 are apart from the substrate 1. The substrate 1 is, for example, a silicon substrate. Each mirror 51 is, for example, a micro mirror having a planar shape a side of which has a length of 10 to 30 μm. The mirrors 51 are disposed in, for example, an arrangement of 600×800 to 1920×1080, and one mirror 51 corresponds to one pixel.

A surface of each mirror 51 is a reflecting surface made of a reflecting metal film such as an aluminum film. The electrooptical apparatus 100 has a first-tier section 100a that includes substrate-side bias electrodes 11, substrate-side address electrodes 12 and 13, etc. that are formed on the one-side surface 1s of the substrate 1, a second-tier section 100b that includes elevated address electrodes 32 and 33 and torsion hinges (twist hinges) 35, and a third-tire section 100c that includes the mirrors 51. In the first-tier section 100a, an address circuit 14 is formed on the substrate 1. The address circuit 14 includes wirings 15, such as work lines and bit lines, and memory cells for selectively controlling operations of the individual mirrors 51, and has a circuit configuration that includes CMOS (complementary metal oxide semiconductor) circuits 16 and that is similar to that of a RAM (random access memory).

The second-tier section 100b includes the elevated address electrodes 32 and 33, the torsion hinges 35, and mirror support post (second support post) 38. The elevated address electrodes 32 and 33 are electrically connected to the substrate-side address electrodes 12 and 13 via electrode posts 321 and 331 and are supported by the substrate-side address electrodes 12 and 13. Hinge arms 36 and 37 extend from two opposite ends of each torsion hinge 35. The hinge arms 36 and 37 of each torsion hinge 35 are electrically connected to a corresponding one of the substrate-side bias electrodes 11 and are supported by the substrate-side bias electrode 11, via hinge support posts (first support posts) 39. Each mirror 51 is electrically connected to a corresponding one of the torsion hinges 35 via a corresponding one of the mirror support post 38 and is supported by the torsion hinge 35. Hereinafter, description will be sometimes made regard to one mirror 51, instead of the plurality of mirrors 51, and with regard to portions and the like that correspond to that mirror 51. Therefore, the mirror 51 is electrically connected to the substrate-side bias electrode 11 via the mirror support post 38, the torsion hinge 35, the hinge arms 36 and 37, and the hinge support posts 39. A bias voltage is applied to the mirror 51 from the substrate-side bias electrode 11. Distal ends of the hinge arms 36 and 37 are provided with stoppers 361, 362, 371 and 372 capable of contacting the mirror 51 when the mirror 51 tilts and therefore preventing contact between the mirror 51 and the elevated address electrodes 32 and 33.

The substrate-side address electrodes 12 and 13 and the elevated address electrodes 32 and 33 of the mirror 51 constitute a driving element that drives the mirror 51 so that the mirror 51 tilts, by creating electrostatic force on the mirror 51. Concretely, when drive voltage is applied to the substrate-side address electrode 12 or 13 and the elevated address electrode 32 or 33, the mirror 51 is drawn and tilted toward the substrate-side address electrode 12 and the elevated address electrode 32 or toward the substrate-side address electrode 13 and the elevated address electrode 33 as shown in FIG. 3A or 3B. At this time, the torsion hinge 35 becomes twisted. Then, when the application of drive voltage to the substrate-side address electrode 12 or 13 and the elevated address electrode 32 or 33 is stopped to discontinue the attractive force to the mirror 51, the torsion hinge 35 delivers force that returns the mirror 51 to a posture parallel to the substrate 1.

In the electrooptical apparatus 100, for example, when the mirror 51 tilts to the side of the substrate-side address electrode 12 and the elevated address electrode 32 as shown in FIG. 3A, an on-state is assumed in which the light emitted from the light source unit 1002 is reflected toward the projection optical system 1004 by the mirror 51. On the other hand, when the mirror 51 tilts to the side of the substrate-side address electrode 13 and the elevated address electrode 33 as shown in FIG. 3B, an off-state is assumed in which the light emitted from the light source unit 1002 is reflected toward a light absorption apparatus 1005. During the off-state, light is not reflected toward the projection optical system 1004. Such driving is performed for each one of the mirrors 51, so that light emitted from the light source unit 1002 is modulated into image light by a plurality of mirrors 51 and then is projected from the projection optical system 1004 to display images.

Incidentally, flat platy yokes that face the substrate-side address electrodes 12 and 13 may be formed integrally with the torsion hinge 35, so that the mirror 51 can be driven by using electrostatic force that acts between the substrate-side address electrode 12 or 13 and a corresponding one of the yokes in addition to the electrostatic force created between the elevated address electrode 32 or 33 and the mirror 51.

Detailed Illustration of Construction of Electrooptical Apparatus 100

Figure 4:
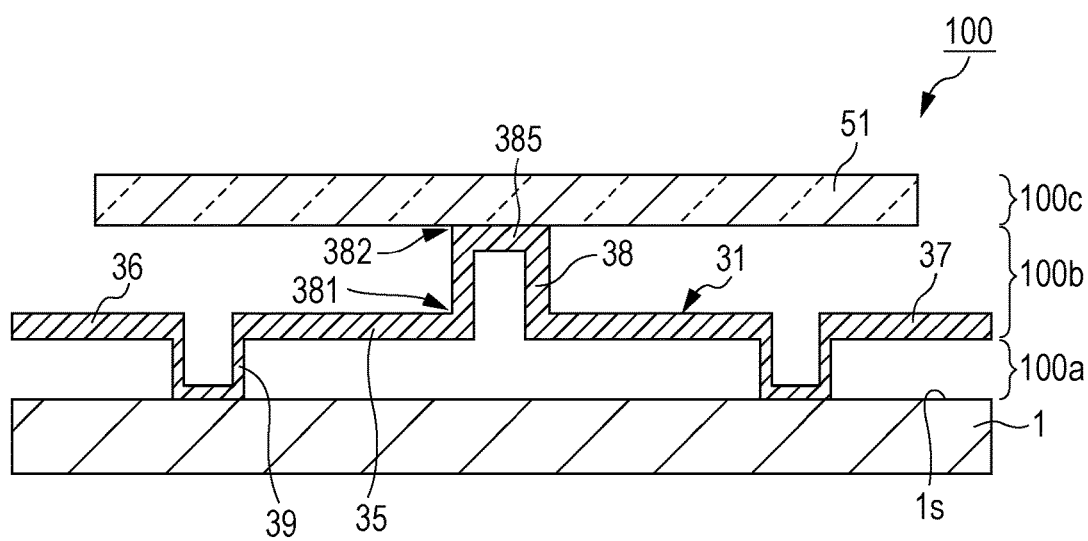
FIG. 4 is a detailed sectional view showing a construction of an electrooptical apparatus according to the invention.

FIG. 4 is a detailed sectional view of the electrooptical apparatus 100 according to the invention. Note that FIG. 4 shows only the second-tier section 100b and the third-tier section 100c of the electrooptical apparatus 100 and omits graphical illustration of the first-tier section 100a that includes the substrate-side bias electrode 11, the substrate-side address electrodes 12 and 13, etc. Besides, FIG. 4 shows only one mirror 51, of the plurality of mirrors 51 formed in the electrooptical apparatus 100, and also shows the mirror support post (second support post) 38 and the torsion hinge (twist hinge) 35 that are provided for that mirror 51.

As shown in FIG. 4, the electrooptical apparatus 100 has, at the one-side surface is side of the substrate 1, the electroconductive torsion hinge 35 that is supported by the substrate 1 via the electroconductive hinge support posts (first support posts) 39. Furthermore, the electrooptical apparatus 100 includes a mirror support post 38 that has a tubular shape and that is protruded from a central portion of the torsion hinge 35 in its length direction to a side opposite the substrate 1 and the mirror 51 supported by the mirror support post 38.

Note that the torsion hinge 35 and the mirror support post 38 are integrally formed. More concretely, in an electroconductive member 31 that includes the torsion hinge 35 and the mirror support post 38 formed integrally with each other, a portion that extends along the one-side surface is of the substrate 1 forms the torsion hinge 35 and a portion protruded toward the side opposite the substrate 1 forms the mirror support post 38. Besides, the hinge support posts 39 are also formed integrally with the electroconductive member 31. Specifically, in the electroconductive member 31, portions protruded from the torsion hinge 5 toward the substrate 1 form the hinge support posts 39, and the hinge support posts 39 are supported by the substrate 1.

In the mirror support post 38, a first end portion 381 at the substrate 1 side (torsion hinge 35 side) has an open end whose opening faces the substrate 1. In the mirror support post 38, a second end portion 382 on the side (mirror 51 side) opposite the substrate 1 and the torsion hinge 35 is a flat plate portion 385 that closes an opening of the mirror support post 38. The mirror 51 is in contact with the opposite side surface of the flat plate portion 385 to the substrate 1. Therefore, the surface of the mirror 51 does not have a dimple.

Production Method for Electrooptical Apparatus

Of steps of production of the electrooptical apparatus 100 according to the invention, steps of forming torsion hinges (twist hinges), mirror support posts (second support posts), and mirrors will centrally be described with reference to FIG. 2B and FIGS. 5A to 5E to FIGS. 8A to 8F. FIGS. 5A to 5B, FIGS. 6A to 6C, and FIGS. 7A to 7D are sectional views illustrating a production method for the electrooptical apparatus 100 according to the invention. FIGS. 8A to 8F are plan views of layers formed in production steps for the electrooptical apparatus 100 according to the invention. Note that although a plurality of mirrors 51 are formed in the electrooptical apparatus 100, FIGS. 5A to 8F show only one mirror 51 and a mirror support post 38 and a torsion hinge 35 that are provided for that mirror 51. Furthermore, in the following description, FIG. 2B is also referred to as appropriate to describe relations among various portions and sites.

Figure 5A:
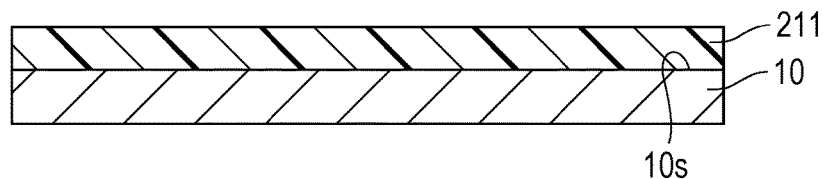
FIGS. 5A to 5E are sectional views illustrating steps of a production method for an electrooptical apparatus according to the invention.
Figure 5B:
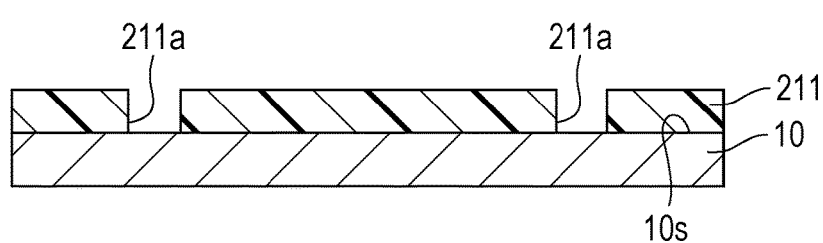
Figure 5C:
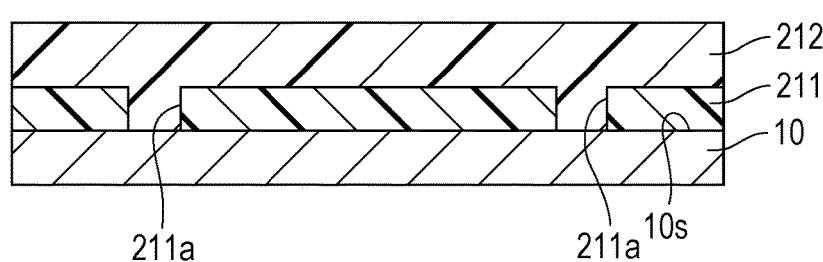
Figure 5D:
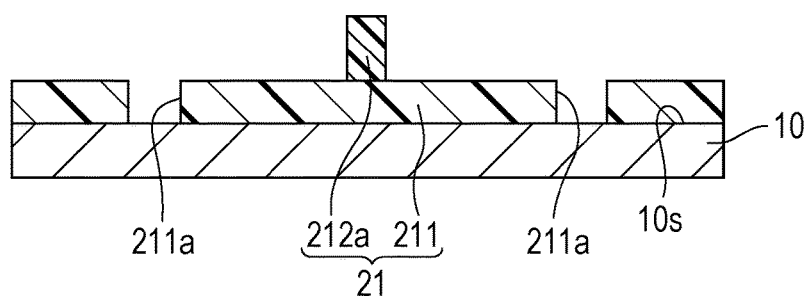

As shown in FIG. 5A, in step ST1, an address circuit 14, substrate-side bias electrodes 11, substrate-side address electrodes 12 and 13, etc. as described above with reference to FIG. 2B are formed on a wafer 10 (substrate) made of a silicon substrate.

Figure 8A:
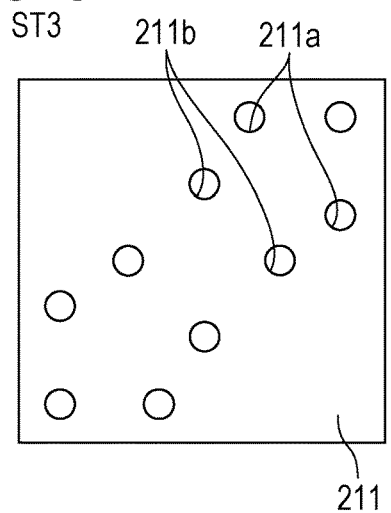
FIGS. 8A to 8F are plan views of layers formed in production steps of an electrooptical apparatus according to the invention.

Next, in step ST2 (first step), a first photosensitive resin layer 211 made of a positive-type organic photoresist or the like is formed on a one-side surface 10s of the wafer 10. Then, in step ST3 (second step) shown in FIG. 5B, the first photosensitive resin layer 211 is exposed to light ("exposed to light" is sometimes expressed simply as "exposed" in this specification) and developed to form hinge support post-dedicated opening portions (first support post-dedicated opening portions) 211a. At that time, electrode post-dedicated opening portions 211b for the electrode posts 321 and 331 of the elevated address electrodes 32 and 33 are also formed as shown in FIG. 8A. The first photosensitive resin layer 211 has a thickness of, for example, 1 µm, and the hinge support post-dedicated opening portions 211a have an opening diameter of, for example, about 0.6 µm. Next, in step ST4 (third step) shown in FIG. 5C, a second photosensitive resin layer 212 made of a positive-type organic photoresist or the like is formed on the opposite side surface of the first photosensitive resin layer 211 to the wafer 10. Next, in step ST5 (fourth step) shown in FIG. 5D, the second photosensitive resin layer 212 is exposed to light and developed to remove photosensitive resin layer 212 from locations coinciding with the hinge support post-dedicated opening portions 211a and form columnar protrusion portions 212a that are protruded toward the side opposite the substrate 1 (wafer 10). The second photosensitive resin layer 212 has a thickness of, for example, 2 µm, and the protrusion portion 212a has an outside diameter of, for example, about 0.6 µm. These steps ST2, ST3, ST4 and ST5 constitute a first sacrificial layer-forming step of forming a first sacrificial layer 21 that includes the hinge support post-dedicated opening portions 211a and the columnar protrusion portions 212a by exposing and developing the photosensitive resin layers.

Figure 5E:
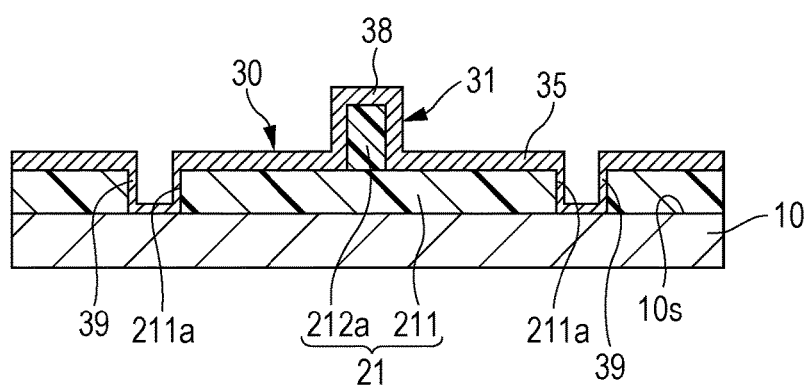
Figure 8D:
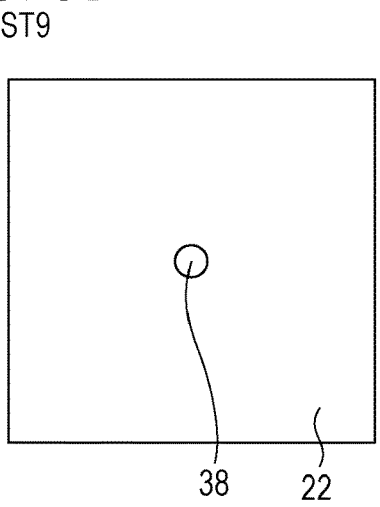
Figure 8B:
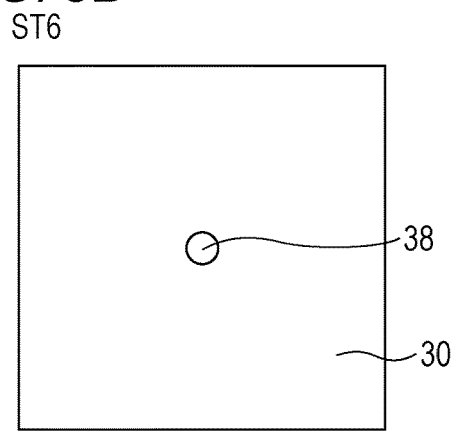

Next, in step ST6 (first electroconductive film-forming step) shown in FIG. 5E, a first electroconductive film 30 is formed entirely over the surface of the first sacrificial layer 21 (the opposite side surface thereof to the wafer 10) (see FIG. 8B). At this time, the first electroconductive film 30 is formed also on wall surfaces and bottom surfaces of the hinge support post-dedicated opening portions 211a. The first electroconductive film 30 is, for example, a single film of an aluminum layer or a laminate film of an aluminum layer and a titanium layer, and has a thickness of, for example, 0.06 µm.

Next, in step ST7 (first patterning step), after a resist mask is formed on the surface of the first electroconductive film 30 (the opposite surface thereof to the wafer 10), the first electroconductive film 30 is patterned to form electroconductive members 31 each of which includes a torsion hinge 35. At that time, in the electroconductive member 31, the first electroconductive film 30 remaining in the hinge support post-dedicated opening portions 211a forms hinge support posts 39 integrally with the torsion hinge 35. Furthermore, in the electroconductive member 31, a mirror support post 38 having a tubular shape and protruded from the torsion hinge 35 toward the side opposite the substrate 1 is formed integrally with the torsion hinge 35. At that time, as shown in FIG. 8C, hinge arms 36 and 37 are formed in the electroconductive member 31. Furthermore, elevated address electrodes 32 and 33 are simultaneously formed and electrode posts 321 and 331 are formed within the electrode post-dedicated opening portions 211b.

Figure 6A:
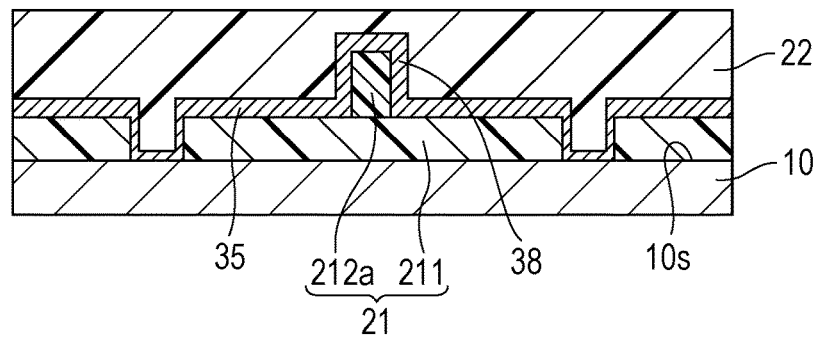
FIGS. 6A to 6C are sectional views illustrating steps of a production method for an electrooptical apparatus according to the invention.

Next, in step ST8 (second sacrificial layer-forming step) shown in FIG. 6A, a photosensitive resin layer made of a positive-type organic photoresist or the like is formed so as to cover the torsion hinges 35 and the mirror support posts 38 from the side opposite the wafer 10, and then is hardened to form a second sacrificial layer 22. The second sacrificial layer 22 has a thickness of, for example, 3 µm.

Figure 6B:
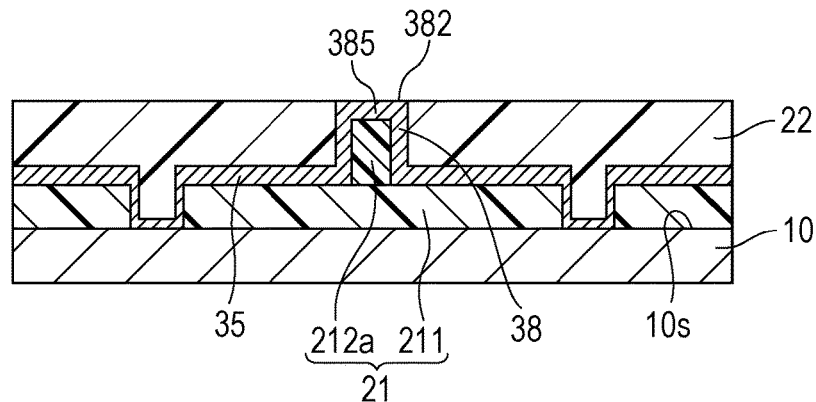

Next, in step ST9 (planarizing step) shown in FIG. 6B, using a CMP (chemical mechanical planarization) method or the like, the second sacrificial layer 22 is planarized from the side opposite the wafer 10 so that the second end portion 382 of each mirror support post 38 becomes bare (see FIG. 8D). In this exemplary embodiment, the second sacrificial layer 22 is planarized so that a flat plate portion 385 remains on the second end portion 382 of each mirror support post 38.

Figure 6C:
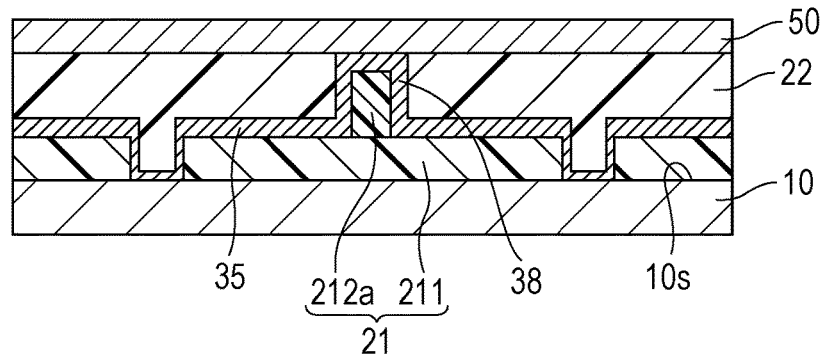

Next, in step ST10 (second electroconductive film-forming step) shown in FIG. 6C, a second electroconductive film 50 is formed on the opposite side of the second sacrificial layer 22 to the wafer 10. The second electroconductive film 50 is, for example, an aluminum layer whose thickness is 0.3 µm.

Figure 7A:
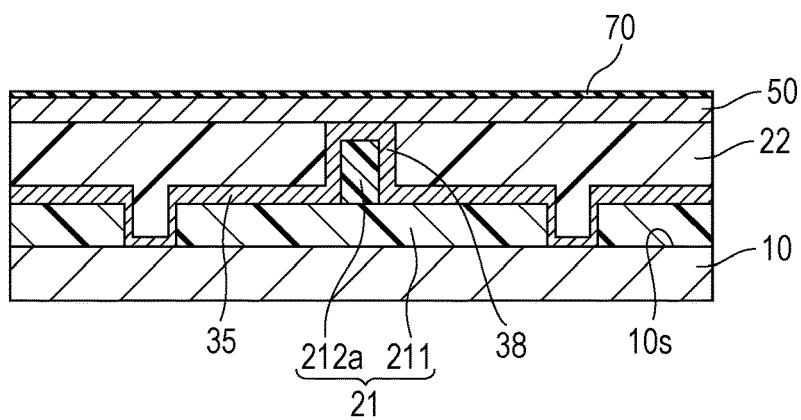
FIGS. 7A to 7D are sectional views illustrating steps of a production method for an electrooptical apparatus according to the invention.
Figure 7B:
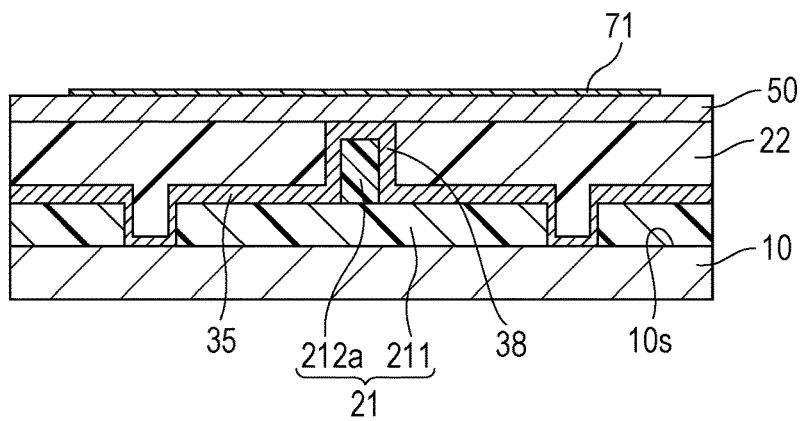
Figure 7C:
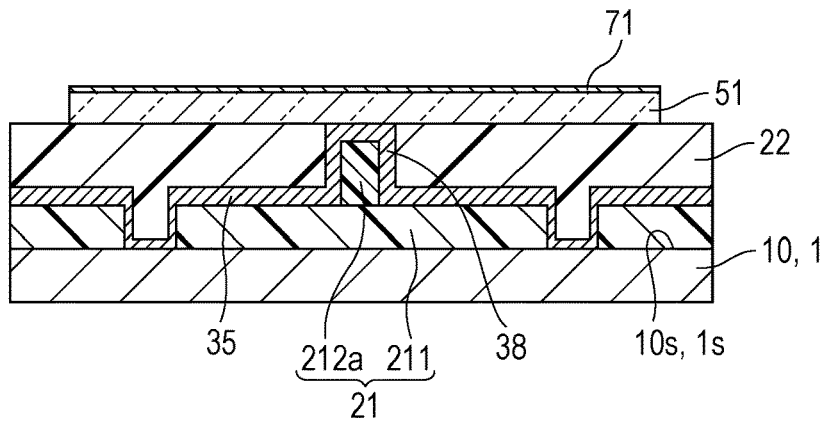
Figure 8E:
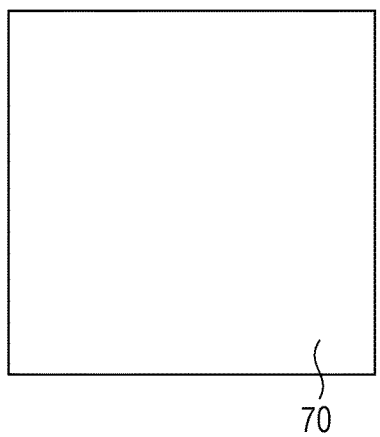
Figure 8C:
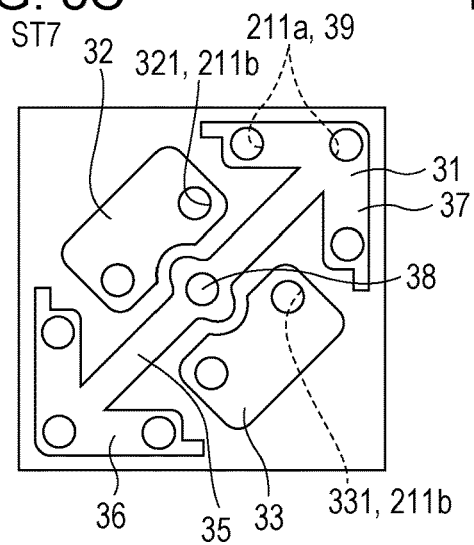
Figure 8F:
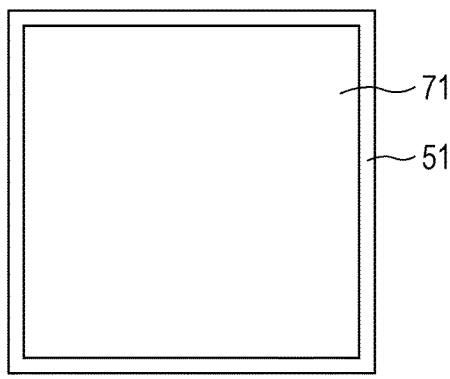

Next, in step ST11 shown in FIG. 7A, an inorganic film 70, such as a silicon oxide film ($SiO_2$), is formed using a PECVD (plasma-enhanced chemical vapor deposition) method or the like (see FIG. 8E). Next, in step ST12 shown in FIG. 7B, after a resist mask is formed on a surface of the inorganic film 70 (the opposite surface thereof to the wafer 10), the inorganic film 70 is patterned to form an etching stopper layer 71 that is identical in planar shape to the mirror 51 (see FIG. 8F). After that, the resist mask is removed. Next, in step ST13 shown in FIG. 7C, using the etching stopper layer 71 as a mask, the second electroconductive film 50 is patterned to form mirrors 51. These steps ST11, ST12 and ST13 constitute a second patterning step.

Next, the wafer 10 is divided into a plurality of substrates 1 of a single-item size.

Figure 7D:
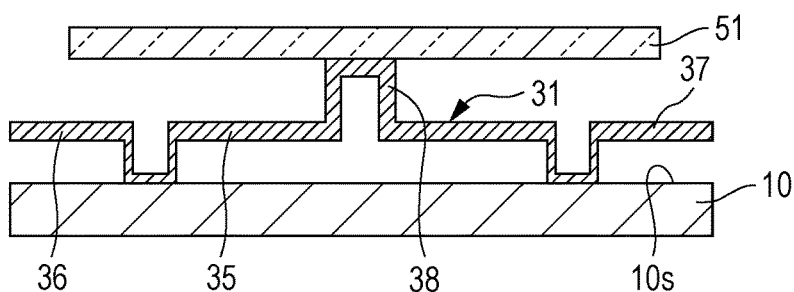

Next, in step ST14 (sacrificial layer-removing step) shown in FIG. 7D, plasma etching or the like is performed to remove the first sacrificial layer 21 and the second sacrificial layer 22. At that time, because the protrusion portions 212a (the second photosensitive resin layer 212) and the first photosensitive resin layer 211 of the first sacrificial layer 21 are in contact with each other between the mirror support posts 38 and the wafer 10, the removal of the first photosensitive resin layer 211 is followed by the removal of the protrusion portions 212a (the second photosensitive resin layer 212). Besides, in this exemplary embodiment, at the time of removing the first sacrificial layer 21 and the second sacrificial layer 22, the etching stopper layer 71 is removed. As a result, an electrooptical apparatus 100 is obtained.

Main Advantageous Effects of the Exemplary Embodiment

As described above, in this exemplary embodiment, the mirror support posts (second support posts) 38 protruded from the torsion hinges (twist hinges) 35 toward the side opposite the substrate 1 have a tubular shape, and the substrate 1-side first end portion 381 of each mirror support post 38 has an open end. Therefore, even though the protrusion portions 212a (first sacrificial layer 21) exist at the time of forming the mirror support posts 38, the first sacrificial layer 21 can be removed. Hence, the resin that forms the sacrificial layer does not remain within the mirror support posts 38, so that even when the temperature of the electrooptical apparatus 100 rises due to emitted light or due to heat produced from the substrate or the like at the time of operation of the drive circuit, production of gas from a sacrificial layer does not occur. Consequently, an event in which gas produced from the sacrificial layer decreases the reflectance of the surface of a mirror 51 (reflecting surface) will not occur. Furthermore, the mirror support post 38 protruded from each torsion hinge 35 toward the side opposite the substrate has a tubular shape and is formed integrally with the torsion hinge 35. Therefore, the strength of a boundary portion between the mirror support post 38 and the torsion hinge 35 does not decrease.

Furthermore, when, on the opposite side of the mirror support post 38 to the substrate 1, the second end portion 382 is a flat portion, a mirror 51 separate from the mirror support post 38 can be connected to the mirror support post 38. Therefore, no dimple is formed on the surfaces of the mirrors 51. Hence, light utilization efficiency can be improved and the decrease in contrast level due to the scattering by a mirror 51 can be restrained.

Furthermore, unlike the case where recess portions are filled with an inorganic material, there is no need to remove the thick inorganic material filling the recess portions from the surfaces of the mirrors 51, so that the mirror support posts 38 that do not cause formation of dimples on the surfaces of the mirror 51 can be efficiently formed.

Another Production Method for First Sacrificial Layer 21

Figure 9A:
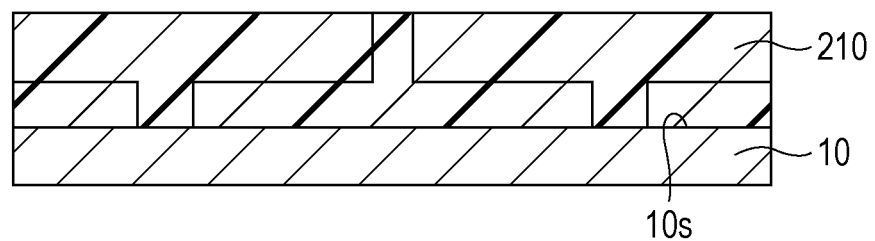
FIGS. 9A and 9B are illustrative diagrams schematically illustrating another production method for a first sacrificial layer that is used in a step of production of an electrooptical apparatus according to the invention.
Figure 9B:
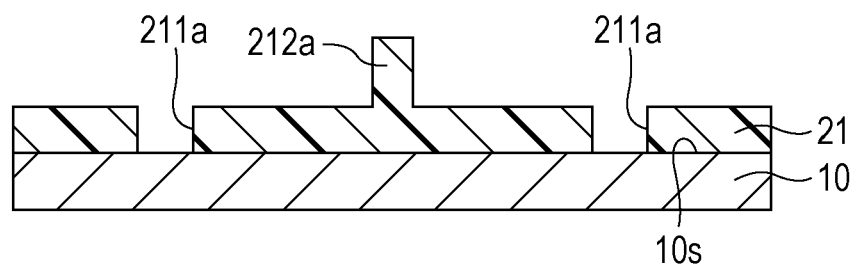

FIGS. 9A and 9B are illustrative diagrams schematically showing another production method for a first sacrificial layer for use in a production step for an electrooptical apparatus 100 according to the invention.

In this exemplary embodiment, in the first sacrificial layer-forming step, a photosensitive resin layer 210 made of a positive-type organic photoresist or the like is first formed on a one-side surface 10s of a wafer 10 as shown in FIG. 9A, and then the photosensitive resin layer 210 is exposed to light using a halftone mask and is subsequently developed. Thus, a first sacrificial layer 21 as shown in FIG. 9B is formed. In the first sacrificial layer 21, hinge support post-dedicated opening portions 211a are formed in fully exposed regions of the photosensitive resin layer 210 and columnar protrusion portions 212a are formed in not-exposed regions because the photosensitive resin layer 210 in half-exposed regions is reduced in thickness.

Incidentally, although in this exemplary embodiment, the first sacrificial layer 21 is formed by one exposure operation with a halftone mask, the exposure of regions in which to form hinge support post-dedicated opening portions 211a and the halftone exposure of regions in which neither a hinge support post-dedicated opening portion 211a nor a columnar protrusion portion 212a is to be formed with a halftone mask may be performed in different steps.

Improved Example of Mirror Support Posts (Second Support Posts) 38

Figure 10:
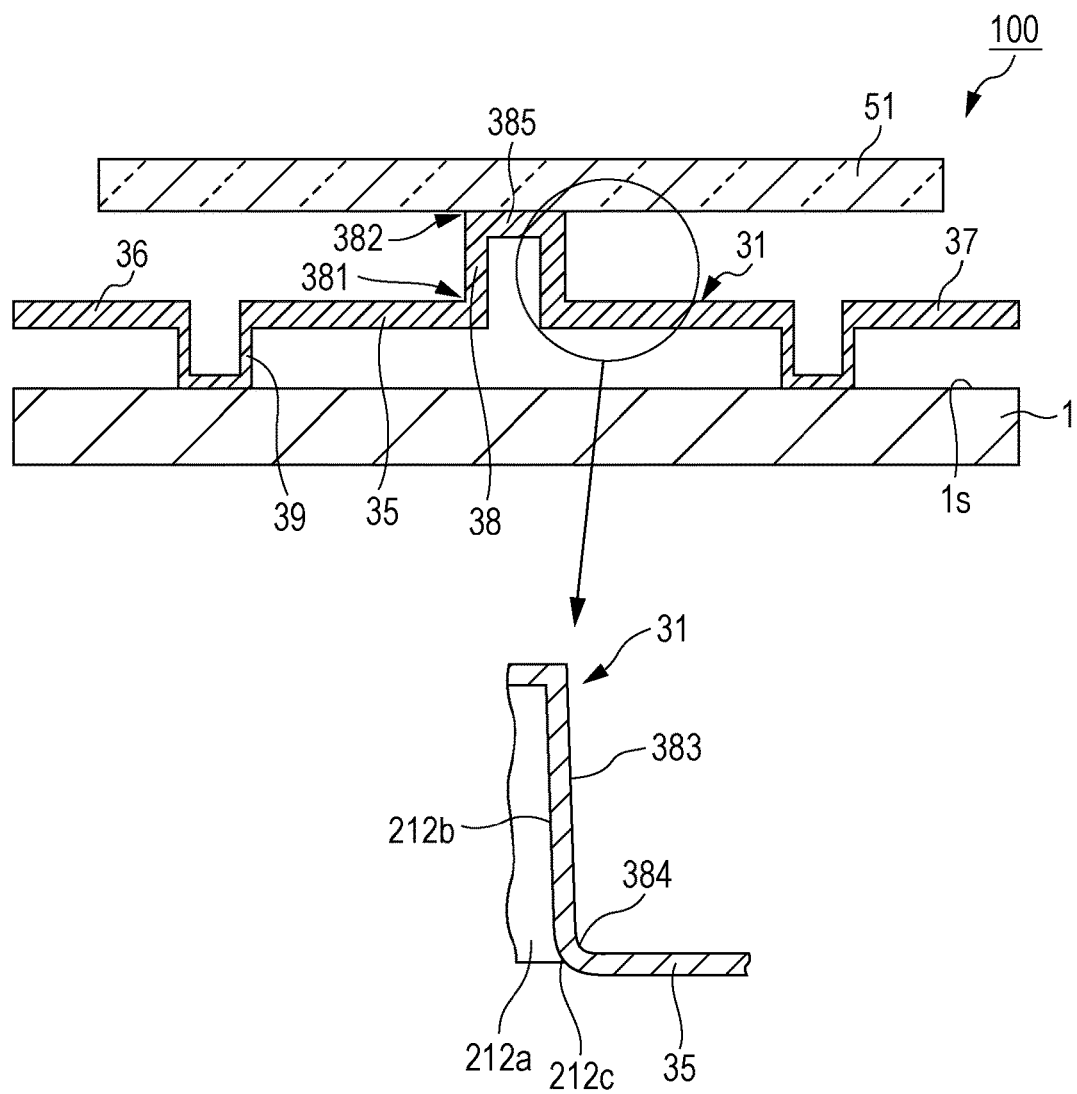
FIG. 10 is an illustrative diagram showing a preferable configuration of a mirror support post (second support post) of an electrooptical apparatus according to the invention.

FIG. 10 is an illustrative diagram showing a preferable exemplary embodiment of a mirror support post (second support post) 38 in an electrooptical apparatus 100 according to the invention. In production of an electrooptical apparatus 100 according to the invention, a positive-type photosensitive resin layer is used to form the first sacrificial layer 21 in the foregoing exemplary embodiments; however, a negative-type photosensitive resin layer may instead be used. When a negative-type photosensitive resin layer is used, an outer peripheral surface 212b of each protrusion portion 212a is likely to be a tapered surface that faces the mirror 51 side (the side opposite the wafer 10), due to the influence of the scattering of light within the photosensitive resin layer. As a result, the outer peripheral surface 383 of each mirror support post 38 becomes a tapered surface that faces the mirror 51 side (the side opposite the wafer 10). Therefore, each mirror support post 38 becomes larger in diameter at a torsion hinge 35 side than at the mirror 51 side, so that the strength of the mirror support posts 38 can be increased.

Furthermore, when a photosensitive resin layer is used, a proximal end 212c of each protrusion portion 212a is likely to have a curved shape, regardless of whether the photosensitive resin layer is of the positive type or the negative type. As a result, portions between each mirror support post 38 and a corresponding torsion hinge 35 has a curved sectional shape. This configuration has an advantage that stress that acts in the torsion hinge 35 from the mirror 51 via the mirror support post 38 does not easily concentrate at a specific site.

Other Exemplary Embodiments

Although in the foregoing exemplary embodiments, the planarizing step (step ST9) described with reference to FIG. 6B performs planarization so that the flat plate portion 385 remains on the second end portion 382 of each mirror support post 38, planarization may be performed until the flat plate portion 385 is removed. In such a case, too, when the second electroconductive film 50 for forming the mirrors 51 is to be formed, the end portion of each mirror support post 38 has a flat portion that is formed by a corresponding one of the protrusion portions 212a of the first sacrificial layer 21. Therefore, no dimple is formed on the surfaces of the mirrors 51.

What is claimed is:

1. A production method for an electrooptical apparatus comprising:
   forming a first sacrificial layer that includes a first opening portion and a columnar protrusion portion protruded toward a side opposite a substrate by exposing and developing a photosensitive resin layer formed at a one surface side of the substrate;
   forming a first electroconductive film on an opposite side of the first sacrificial layer to the substrate and inside the first opening portion;
   forming a first support post made of the first electroconductive film formed inside the first opening portion, a torsion hinge provided integrally with the first support post, and a tubular second support post that is protruded from the torsion hinge toward the side opposite the substrate and that is provided integrally with the torsion hinge, by patterning the first electroconductive film;
   forming a second sacrificial layer on the torsion hinge and on an opposite side of the second support post to the substrate;
   causing the second support post to be bare by planarizing the second sacrificial layer from the side opposite the substrate;
   forming a second electroconductive film on an opposite side of the second sacrificial layer to the substrate;
   forming a mirror by patterning the second electroconductive film; and
   removing the first sacrificial layer and the second sacrificial layer.

2. The production method according to claim 1, wherein the first sacrificial layer is formed by performing a first step of forming a first photosensitive resin layer, a second step of forming the first opening portion by exposing and developing the first photosensitive resin layer, a third step of forming a second photosensitive resin layer that lies over an opposite side of the first photosensitive resin layer to the substrate, and a fourth step of forming the protrusion portion by exposing and developing the second photosensitive resin layer.

3. The production method according to claim 1, wherein after a photosensitive resin layer is formed, the first sacrificial layer that includes the columnar protrusion portion protruded toward the side opposite the substrate is formed by exposing the photosensitive resin layer with a halftone mask and then developing the photosensitive resin layer.

4. The production method according to claim 1, wherein as the photosensitive resin layer, a positive-type photosensitive resin layer is used.

5. The production method according to claim 1, wherein as the photosensitive resin layer, a negative-type photosensitive resin layer is used.

* * * * *